United States Patent [19]

Johnson

[11] Patent Number: 4,472,238

[45] Date of Patent: Sep. 18, 1984

[54] PROCESS USING PLASMA FOR FORMING CONDUCTIVE THROUGH-HOLES THROUGH A DIELECTRIC LAYER

[75] Inventor: Daniel D. Johnson, Yorklyn, Del.

[73] Assignee: E. I. Du Pont de Nemours and Company, Wilmington, Del.

[21] Appl. No.: 558,309

[22] Filed: Dec. 5, 1983

[51] Int. Cl.³ .................. B44C 1/22; B29C 17/08; C03C 15/00; C23F 1/02
[52] U.S. Cl. ............................... 156/643; 29/853; 156/644; 156/645; 156/646; 156/656; 156/666; 156/668; 156/902; 204/192 E
[58] Field of Search ............ 156/644, 646, 643, 645, 156/656, 655, 659.1, 661.1, 666, 668, 902; 204/192 E; 427/97; 29/852, 879, 882, 853; 174/68.5; 430/313, 317, 318; 252/79.1; 228/111, 3.1, 44.1, 116, 173 C, 180 R

[56] References Cited

U.S. PATENT DOCUMENTS

| | | | |
|---|---|---|---|
| 3,557,446 | 1/1971 | Charschan | 29/625 |
| 3,969,815 | 7/1976 | Hacke et al. | 29/265 |
| 4,184,909 | 1/1980 | Chang et al. | 156/643 |
| 4,240,869 | 12/1980 | Diepers | 156/644 X |
| 4,277,321 | 7/1981 | Bartlett et al. | 156/644 X |
| 4,289,573 | 9/1981 | Economy et al. | 21/306 |
| 4,319,708 | 3/1982 | Lomerson | 228/111 |

OTHER PUBLICATIONS

J. W. Coburn, "Plasma Etching", pp. 1–7.
CPI Prior Art Search Report, J. P. Daniszewski, pp. 2–8.

*Primary Examiner*—William A. Powell

[57] ABSTRACT

A conductive through-hole is formed by plasma etching a hole completely through a dielectric sandwiched between conductors and by deforming at least one conductor which has been undercut during the etching.

12 Claims, 10 Drawing Figures

F I G. 4
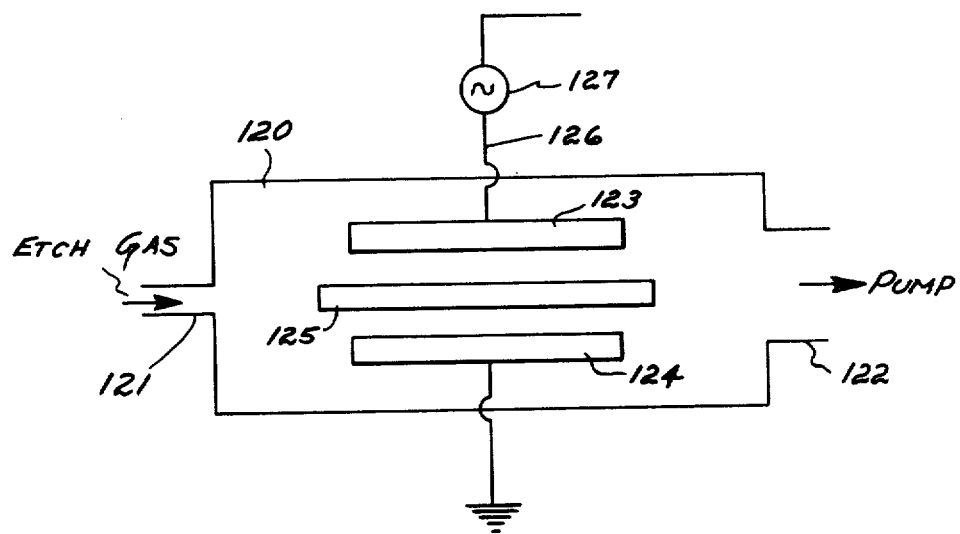

PROCESS USING PLASMA FOR FORMING CONDUCTIVE THROUGH-HOLES THROUGH A DIELECTRIC LAYER

BACKGROUND OF THE INVENTION

The present invention is directed to an improved process for forming conductive through-holes through a dielectric, i.e., an insulating layer, sandwiched between two conductive layers. The process is particularly useful in formation of printed circuit boards.

U.S. Pat. No. 3,969,815 discloses a process for providing an electrical interconnection of two metal layers positioned on opposite sides of a substrate. A hole is initially drilled or bored through the two metal layers and the intermediate insulating layer. The hole in the insulating layer is enlarged by a selective etching process which only etches the insulating layer to form an enlarged annular hole in the insulating layer which undercuts the metal layer portions. Thereafter these overhanging metal portions on opposite sides of the insulating layer are deformed by application of pressure to contact or almost contact one another. The deformed metal portions are coated by galvanic metal which is overcoated by a thin layer, preferably tin, to form a conductive path.

SUMMARY OF THE INVENTION

The present invention is directed to a process for making an electrically conducting path in a dielectric layer sandwiched between two conductive layers comprising
  (a) forming a hole completely through one of the conductive layers without substantially removing material from the dielectric layer;
  (b) through said hole plasma etching the dielectric layer whereby a pathway is formed completely through the dielectric layer between the conductive layers and whereby the conductive layer is undercut of dielectric material adjacent to the hole in said conductive layer;
  (c) deforming the conductive layer which has been undercut toward the other conductive layer, and
  (d) forming an electrical conducting path between the two conductive layers through the pathway.

BRIEF DESCRIPTION OF THE DRAWINGS

FIG. 4 is a schematic representation of a plasma apparatus useful in the present invention.

DETAILED DESCRIPTION OF THE INVENTION

Figure 1A:
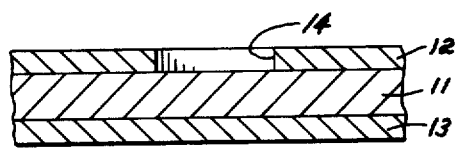
FIG. 1A is a cross-sectional view of a composite article of an electrically conductive layer, a dielectric layer and an electically conductive layer with a hole through one conductive layer.

The present invention is particularly adapted for forming a conductive through-hole, and particularly a great number of precisely located through-holes, through a dielectric layer sandwiched between two electrically conducting materials. Generally the electrically conductive layers are metal, preferably copper, while the dielectric is generally an electrically insulating polymer.

Composites of two layers of an electrical conductive material separated by a dielectric are conventional starting materials for forming circuit boards and are suitable herein. Generally the dielectric layer will be at least one mil in thickness and the conductive layer will be 0.7 to 2.8 mil thick, e.g., copper foil, although both thinner and thicker layers can be used. The materials of construction of the insulating layer are not critical except that they can be removed by plasma etching techniques.

In the present invention prior to plasma etching of the dielectric, hole formation is necessary in one of the conductive layers without any substantial removal of material from the dielectric layer. The preferred technique of hole formation in the conductive layer uses photolithographic techniques and chemical etching which are well-known in the formation of printed circuits. An example of such chemical etching involves lamination of a negative acting photosensitive film to at least one of the metal layers at the conductor surface which does not face the dielectric layer, exposing the photosensitive polymer to actinic radiation through a photomask, developing and removing unexposed photosensitive polymer to expose portions of the metal layer and thereafter chemically etching completely through the thickness of the exposed conductive layer. This chemical etching step removes little or no material from the dielectric polymer layer. A suitable process is disclosed in Celeste U.S. Pat. No. 3,469,982. Positive working photopolymers and processing techniques well known in the art can likewise be used, e.g., Cohen and Heiart U.S. Pat. No. 4,193,797.

The diameter of the hole photolithographically formed in the conductive layer can be small, e.g., in the range of 25 to 250 microns and precisely located relative to features in the circuit. Also the photolithographic process can form a great number of holes simultaneously, e.g., hundreds or thousands of holes can be easily formed in a composite blank for a circuit board of a dimension of 12 inches times 12 inches. In comparison, mechanically drilling or punching a hole has disadvantages in that it is a laborious process with an increasing chance of error or loss in precision as the number of holes increases. Also mechanically drilling or punching of holes smaller than 800 microns results in increased cost due to drill breakage and a hole diameter smaller than 325 microns cannot generally be achieved in production.

Punching or drilling generally results in holes completely through the metal, dielectric and second metal layers.

For plasma etching the metal conductive layer serves as a mask for the dielectric since the plasma attacks the dielectric where a hole has been formed. The metal is substantially unaffected by the plasma or, at least, the etching rate of the dielectric is considerably faster than the etching rate of the conductor.

Various types of plasma gases may be used. The etching gas is chosen so as to produce species which react chemically with the material to be etched to form a reaction product which is volatile. Mixtures of various plasma etch gases can also be used. The preferred gas composition to be used where the insulating material or organic material is a polyimide and the mask is copper is carbon tetrafluoride/oxygen in the ratio of 50/50 to 10/90 (by volume).

Turning to the Figures, the embodiment of FIG. 1A shows a composite with a hole 14 chemically etched in the conductive layer 12. The etchant for the conductive layers has not significantly attacked the dielectric layer 11.

Figure 1B:
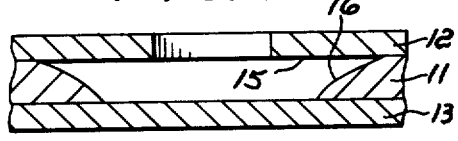
FIG. 1B is a cross-sectional view of the article of FIG. 1A with the addition of a hole formed through the dielectric layer by etching.

Thereafter plasma etching is employed to etch the dielectric layer through the hole formed in the conductive layer. The composite article formed thereby is shown in FIG. 1B wherein an overhanging portion 15 is present in the conductive layer 12. The wall dielectric construction 16 is angular due to the isotropic etching process whereby the plasma removes material completely through the thickness of the dielectric layer while at the same time etching the dielectric in a lateral direction in formation of a through-hole.

Figure 1C:
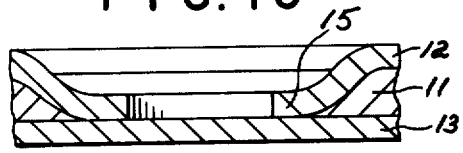
FIG. 1C is a cross-sectional view of the article of FIG. 1B except the electrically conductive layer has been deformed into the hole in the dielectric layer.

Upon completion of the hole completely through the dielectric, the undercut conductive layer 15 is deformed to contact or come in close contact with layer 13. A suitable method is direct pressure application on the undercut conductive portions. This article embodiment is shown in FIG. 1C wherein the conductive portion 15 covers the etched dielectric surface 16. Thereafter if necessary, the deformed electrically conductive material may be electrolytically plated with a metal such as copper or soldered with molten tin/lead solder or welded to complete or ensure an electrically conductive path through the dielectric layer. The formation of through-holes in accordance with the present technique allows use of thin conductive layers, e.g., 3.0 mils or less which cannot be used with drilling techniques in which a hole is drilled through the dielectric layer since the drilling would destroy the integrity of the second conductor, i.e., a hole would be formed in this second conductor layer.

Figure 2A:
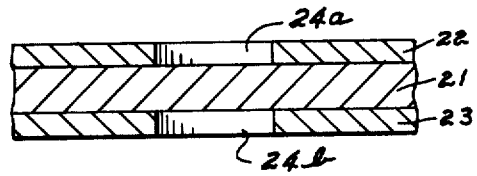
FIG. 2A is a cross-sectional view of a composite article of an electrically conductive layer, a dielectric layer and an electrically conductive layer with a hole through each of the conductive layers.
Figure 2B:
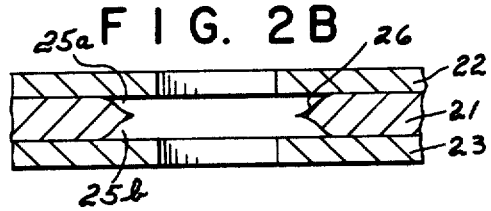
FIG. 2B is a cross-sectional view of the article of FIG. 2A with the addition of a hole formed in the dielectric layer by etching.
Figure 2C:
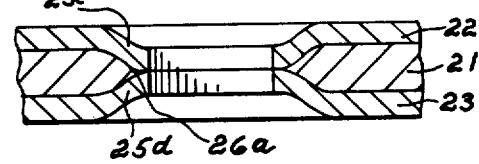
FIG. 2C is a cross-sectional view of the article of FIG. 2B except the electrically conductive layers have been deformed into the hole in the dielectric layer.

In an alternate embodiment of the present invention shown in FIGS. 2A, 2B and 2C, holes 24a and 24b are formed in both conductive layers 22 and 23 opposite one another rather than in one conductor shown in FIG. 1A. The same process steps are employed except etching of the dielectric can proceed simultaneously from opposite surfaces. The metal conductors are undercut at 25a and 25b. With simultaneous opposite etching of the dielectric two distinct angular wall portions are present in the dielectric wall 26. After completion of the etching of the polymer, the undercut conductive portions are deformed toward the other respective conductive layer to make contact or approximate contact. FIG. 2C illustrates the compressed conductive portions 25c and 25d in contrast with the dielectric surface 26a. Thereafter, if desired, electrolytic plating, soldering or welding may take place to ensure electrical conductivity.

Figure 3A:
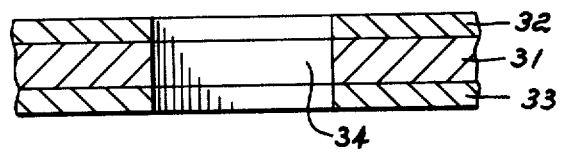
FIG. 3A is a cross-sectional view of a composite article of an electrically conductive layer, a dielectric layer and an electrically conductive layer with a hole through the composite.
Figure 3B:
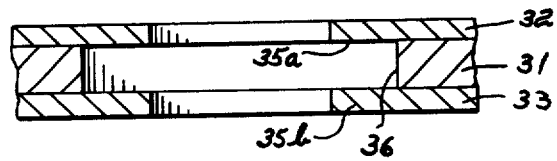
FIG. 3B is a cross-sectional view of the article of FIG. 3A with the addition of an enlarged hole in the dielectric layer.
Figure 3C:
FIG. 3C is a cross-sectional view of the article of FIG. 3B except the electrically conductive layers have been deformed into the hole.

The embodiment of FIGS. 3A, 3B and 3C illustrate the article and through-holes formed following the teachings of U.S. Pat. No. 3,969,815. A composite of an electrically conductive layer 32, a dielectric 31 and an electrically conductive layer 33 has a hole 34 drilled or punched therein which is shown in FIG. 3A. In the FIG. 3B embodiment, a liquid chemical etchant has been used to selectively etch away the dielectric layer to form a wall 36 which is substantially planar with electrically conductive overhang portions 35A and 35B. In the FIG. 3C embodiment deformation of these conductive layers into the hole in the dielectric has taken place to form compressed, pinched conductive portions 35c and 35d with dielectric surface portion 36a bowed outwardly due to the force of the deformation of the conductive layers.

With the prior art drilling operation, hole formation takes place in both conductors unlike the FIG. 1A, FIG. 1B and FIG. 1C embodiments where only one conductor has any hole formed therein. Foils and other thin sheets can be used for the conductor which retains its integral shape. Also in comparison with the prior art, the article of the FIG. 1C and FIG. 2C embodiments can have less stress for the conductive portions in the passageways. Deformation of the dielectric takes place in formation of the conductive passageway shown in FIG. 3C of the prior art which can cause greater residual stress than the embodiments of the present invention. Also generally the smallest hole that can be practically formed by mechanically drilling is of the order of 325 microns. In contrast with a chemical etching technique preferred in the present invention the hole in the conductive layer can be considerably smaller, e.g., in the range of 25 to 250 microns. Of course if necessary larger holes can be formed.

FIG. 4 shows a schematic of a planar plasma etching apparatus which is useful in this invention. It consists of a chamber 120 which has an inlet 121 and an outlet 122 through which the plasma gas is pumped out. Within chamber 120, the radio frequency powered electrode (cathode) 123 which is connected by a conductor 126 to a conventional radio frequency generator 127, and the grounded electrode 124 are located. The material to be etched is located between electrodes 123 and 124. After the plasma gas has been introduced into the chamber the generator 127 is activated to create a gas plasma according to well known principles. A suitable set of operating conditions for use with a copper conductor and a polyimide dielectric in a Branson Plasma Etcher Model 7411 are:

| | |
|---|---|
| RF Power | >2,000 watts |
| RF Power Density | >.06 watts/in$^2$ |
| Operating Pressure | >10 microns |
| Gas Composition | 50/50 → 10/90 by volume $CF_4/O_2$ |
| Gas Flow Rate | >150 cc/min. |
| RF Frequency | 13.56 MHz |
| Part Bias | Cathode, anode or plasma potential |
| Exhaust Rate | >245 CFM |

The process of the present invention is particularly adapted to formation of multiple layers of circuitry. Illustratively after completion of a conductive path through the dielectric layer a new dielectic layer can be applied to at least one of the conductive layers and a new conductive layer can be applied to this dielectric layer. Application of the new dielectric and new conductive layers can be undertaken simultaneously to the article containing the electrically conductive through-hole, e.g., a dielectric layer and conductive layer compositive are laminated onto the conductive layer previously processed in formation of at least one through-hole. Thereafter a conductive path is formed through the newly applied dielectric layer in accordance with the technique previously disclosed.

To further illustrate the process of the present invention the following examples are provided. All parts and percentages are by weight unless otherwise indicated.

EXAMPLE 1

A 6"×6" (15.24 cm×15.24 cm) panel of 0.006 inch (0.01524 cm) thick Pyralux ®LF-9111 laminate (manufactured by the Du Pont Company) was provided with a circuit pattern on one side and 10 mil (0.0254 cm) diameter holes in the copper foil on the other side by using Riston ®215R and the process described in U.S. Pat. No. 3,469,982. The holes coincide with the location where the through-holes will be formed between the copper foil having 10 mil holes and the foil on the circuit patterned side. Where connections are to be made to the aluminum plate the copper foil on the circuit side is removed. The circuit pattern side of the panel was then laminated to an aluminum plate using 0.002 inch (0.0057 cm) thick Pyralux ®WA adhesive in a lamination press at 350 psi, at 350° F. (176.7° C.) for 45 minutes.

The part was then plasma etched in a plasma etching chamber of a Branson Plasma Etcher Model 7411. A vacuum was drawn to a base pressure of 50 microns and the gas comprising 70% $O_2$, 29% $CF_4$ and 1% argon by volume was introduced until the chamber pressure reached 200 microns. The pump rate was 550 CFM and gas flow rate was estimated to be 750 cc/min. The RF power was turned onto a setting of 3800 watts for a duration of 70 minutes. The aluminum plate acts as a mask to the plasma protecting the back circuit pattern. The copper foil with the 0.01 inch (0.0254 cm) holes acts as a mask to the plasma on the other side of the panel allowing etching to occur only where the holes have been formed in the copper foil. The plasma etches through the 0.003 inches (0.0076 cms) of dielectric until it contacts the metal foil circuit pattern or through 0.005 inches (0.0127 cms) of dielectric until it reaches the aluminum plate.

The overhangs were then collapsed by placing the panel in a laminating press. A cardboard pressure equalizing sheet was placed next to the copper foil with the cantilevered beam. A silicone rubber pad was placed on top of the cardboard sheet and a steel caul plate was placed over it. 18,000 psi pressure was applied for 10 seconds to collapse the overhang into the hole. A circuit pattern was then formed in the copper foil using conventional imaging and etching techniques described in U.S. Pat. No. 3,469,982. To enhance the interconnection, the panel was dipped in a 60/40 tin/lead solder at 500° F. (260° C.) for 5 seconds to coat the interconnection with solder.

EXAMPLE 2

Overhangs were formed in the panel and collapsed as described above with one exception, the circuit pattern side of the panel was laminated to a copper clad glass epoxy board instead of the aluminum plate before plasma etching. After plasma etching and collapsing, the panel was then pattern plated in a copper sulfate plating bath for 30 minutes at 30 ASF and in a tin/lead fluoroborate bath for 15 minutes at 15 ASF to enhance the via connection between the upper and lower conductive layers. Finally, the plating resist was stripped and the background copper was etched using conventional techniques to form a circuit pattern on the top.

EXAMPLE 3

A 6"×6" (15.24 cm×15.24 cm) panel of 0.006 inch (0.1524 cm) thick Pyralux ®-9111 laminate (manufactured by the Du Pont Company) with holes ranging from 3 to 15 mils (0.0076–0.038 cm) photolithographically formed in both of the copper foils was used. The panel was plasma etched using the process and apparatus described in Example 1 to give a overhangs of copper foil on both sides of the panel. The overhangs were collapsed into the hole, a circuit pattern was formed on both of the copper foils, and the interconnection was enhanced as described in Example 1.

EXAMPLE 4

A 0.004 inch (0.0102 cm) thick laminate of epoxy resin impregnated, Kevlar ® fabric having 0.0014 inch copper foils adhered to both sides was coated with Riston ® 215R on both sides. 0.010 inch (0.0254 cm) and 0.005 inch (0.0127 cm) holes were photolithographically formed in the copper foils using conventional techniques described in U.S. Pat. No. 3,469,982.

The panel was plasma etched using the process and apparatus described in Example 1 to give a overhangs of copper foil on both sides of the panel. The overhangs were collapsed into the hole, a circuit pattern was formed on both of the copper foils, and the interconnection was enhanced as described in Example 1.

What is claimed is:

1. A process for making an electrically conducting path in a dielectric layer sandwiched between two conductive layers comprising
   (a) forming a hole completely through one of the conductive layers without substantially removing material from the dielectric layer;
   (b) through said hole plasma etching the dielectric layer whereby a pathway is formed completely through the dielectric layer between the conductive layers and whereby the conductive layer is undercut of dielectric material adjacent to the hole in said conductive layer;
   (c) deforming the conductive layer which has been undercut toward the other conductive layer, and
   (d) forming an electrical conducting path between the two conductive layers through the pathway.

2. The process of claim 1 where a hole is formed only in one conductive layer in step (a).

3. The process of claim 2 wherein the conductive layer which does not have a hole formed therein in step (a) has a thickness not greater than 3.0 mils.

4. The process of claim 2 wherein the conductive layer is copper.

5. The process of claim 1 wherein holes are formed in the conductive layers on opposite sides of the polymeric dielectric layer in step (a) and the dielectric layer is plasma etched through the opposite holes in the conductive layers in step (b). and both conductive layers are deformed toward each other in step (c).

6. The process of claim 1 wherein the electrical connection in step (d) is formed by contact of the two conductive layers.

7. The process of claim 1 wherein the formation of the electrical connection includes application of an electrically conductive material to the conductive layer in the pathway.

8. The process of claim 1 wherein a plurality of holes are simultaneously formed in step (a) and a plurality of pathways are simultaneously formed in step (b).

9. The process of claim 1 wherein the dielectric layer has a thickness of at least one mil.

10. The process of claim 1 wherein steps (c) and (d) are performed substantially simultaneously.

11. The process of claim 1 wherein after step (d) a new dielectric layer and a new conductive layer are applied to one of the conductive layers with the new dielectric layer sandwiched between two conductive layers followed by the step of
   (a) forming a hole completely through the new conductive layer without substantially removing material from the new dielectric layer;
   (b) through said hole plasma etching the new dielectric layer whereby a pathway is formed completely through the new dielectric layer between the conductive layers and whereby the new conductive layer is undercut of dielectric material adjacent to the hole in said new conductive layer;
   (c) deforming the new conductive layer which has been undercut toward the other conductive layer, and
   (d) forming an electrical conducting path between the two conductive layers through the pathway.

12. A process for making an electrical conducting path through a dielectric layer sandwiched between two copper conductive layers comprising:
   (a) forming a hole completely through one copper conductive layer by chemical etching without substantially removing material from the dielectric layer or the second copper layer;
   (b) plasma etching the polymeric dielectric layer through said hole whereby a pathway is formed completely through the dielectric layer whereby one copper layer is undercut of dielectric material adjacent the hole in the copper layers;
   (c) deforming the undercut copper layer toward the second copper layer; and
   (d) forming an electrical connection between the two copper layers through the pathway.

* * * * *